(12) United States Patent
Kraus et al.

(10) Patent No.: US 12,033,835 B2
(45) Date of Patent: Jul. 9, 2024

(54) MODULAR MICROWAVE SOURCE WITH MULTIPLE METAL HOUSINGS

(71) Applicant: Applied Materials, Inc., Santa Clara, CA (US)

(72) Inventors: Philip Allan Kraus, San Jose, CA (US); Robert Moore, Bigfork, MT (US); James Carducci, Sunnyvale, CA (US); Richard Fovell, San Jose, CA (US); Sathya Swaroop Ganta, Sunnyvale, CA (US); Karthikeyan Balaraman, Bangalore (IN); Silverst Rodrigues, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 580 days.

(21) Appl. No.: 16/898,259

(22) Filed: Jun. 10, 2020

(65) Prior Publication Data

US 2021/0391149 A1 Dec. 16, 2021

(51) Int. Cl.
*H01J 37/32* (2006.01)
(52) U.S. Cl.
CPC .... *H01J 37/32467* (2013.01); *H01J 37/3222* (2013.01); *H01J 37/3244* (2013.01); *H01J 37/32513* (2013.01)
(58) Field of Classification Search
CPC . H01J 37/32192–32311; H01J 37/3244; H01J 37/32467; H01J 37/32513
See application file for complete search history.

(56) References Cited

U.S. PATENT DOCUMENTS 5,053,678 A * 10/1991 Koike ............... H01J 27/18
315/111.41
6,095,083 A * 8/2000 Rice ................. H01J 37/32165
118/724

(Continued)

FOREIGN PATENT DOCUMENTS

CN 1978697 6/2007
EP 1300878 A1 4/2003

(Continued)

OTHER PUBLICATIONS

International Preliminary Report on Patentability from U.S. Patent Application No. PCT/US2021/031938 dated Dec. 22, 2022, 5 pgs.

(Continued)

*Primary Examiner* — Benjamin Kendall
(74) *Attorney, Agent, or Firm* — Schwabe, Williamson & Wyatt, P.C.

(57) ABSTRACT

Embodiments disclosed herein include a modular microwave source array. In an embodiment, a housing assembly for the source array comprises a first conductive layer, wherein the first conductive layer comprises a first coefficient of thermal expansion (CTE), and a second conductive layer over the first conductive layer, wherein the second conductive layer comprises a second CTE that is different than the first CTE. In an embodiment, the housing assembly further comprises a plurality of openings through the housing assembly, where each opening passes through the first conductive layer and the second conductive layer.

12 Claims, 10 Drawing Sheets

(56) References Cited

U.S. PATENT DOCUMENTS

| | | | |
|---|---|---|---|
| 6,444,085 B1* | 9/2002 | Collins | H01J 37/32467 257/E21.252 |
| 6,790,311 B2* | 9/2004 | Collins | C23C 16/517 156/345.47 |
| 2013/0264014 A1 | 10/2013 | Ilzuka | |
| 2015/0325821 A1* | 11/2015 | Bradwell | H01M 50/191 156/60 |
| 2015/0371828 A1* | 12/2015 | Stowell | C23C 16/4405 118/723 AN |
| 2016/0121595 A1* | 5/2016 | Yoon | G02B 7/192 156/538 |
| 2018/0294143 A1* | 10/2018 | Chua | H01J 37/32247 |
| 2018/0323043 A1* | 11/2018 | Kraus | H01J 37/32238 |
| 2019/0088456 A1 | 3/2019 | Behara et al. | |

FOREIGN PATENT DOCUMENTS

| | | |
|---|---|---|
| JP | H11135296 A | 5/1999 |
| JP | 2002075690 A | 3/2002 |
| JP | 2012089714 A | 5/2012 |
| JP | 2013191593 A | 9/2013 |
| JP | 2019216086 A | 12/2019 |
| KR | 10-2013-0061030 | 6/2013 |
| TW | 202003913 A | 1/2020 |

OTHER PUBLICATIONS

International Search and Written Opinion from U.S. Patent Application No. PCT/US2021/031938 dated Sep. 2, 2021, 8 pgs.
Official Letter from Taiwan Patent Application No. 110118610 dated Nov. 24, 2023, 8 pgs.
Notice of Reasons for Rejection from Japanese Patent Application No. 2022-575369 dated Jan. 29, 2024, 8 pgs.

* cited by examiner

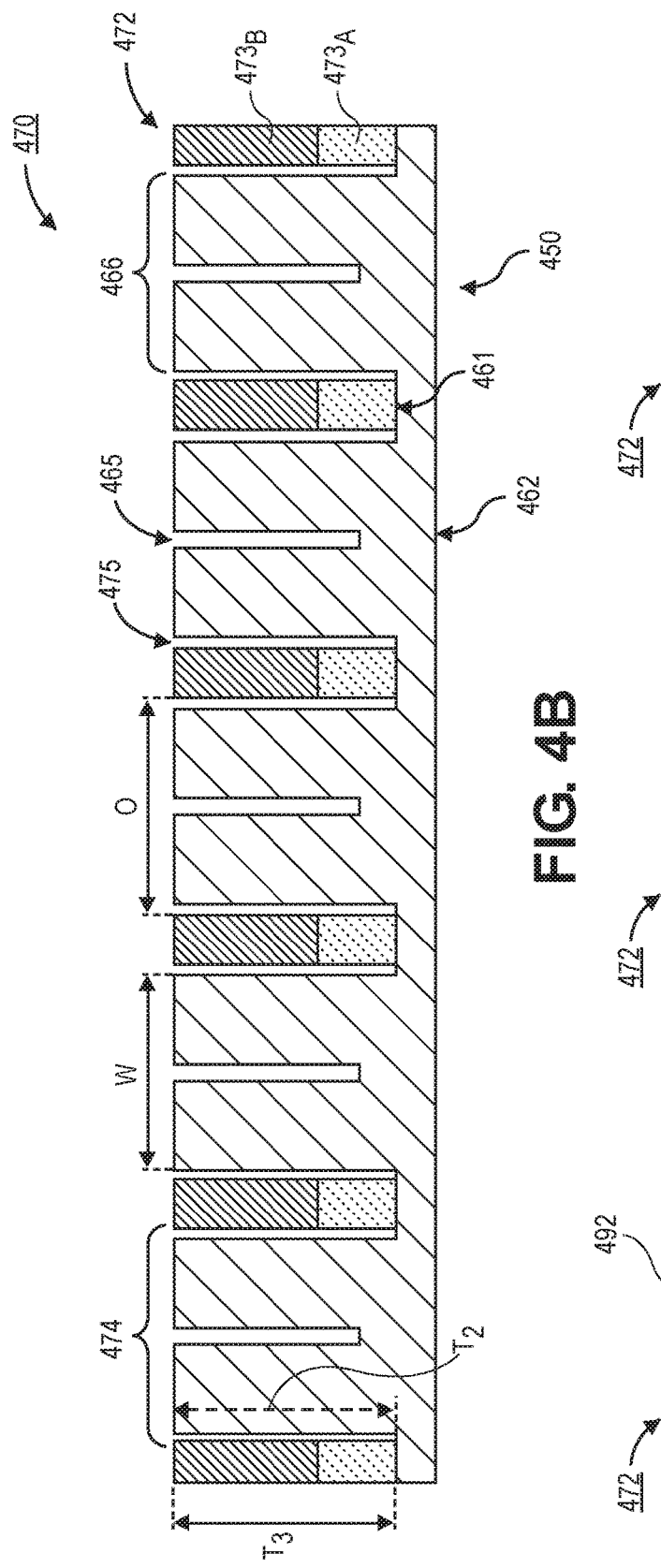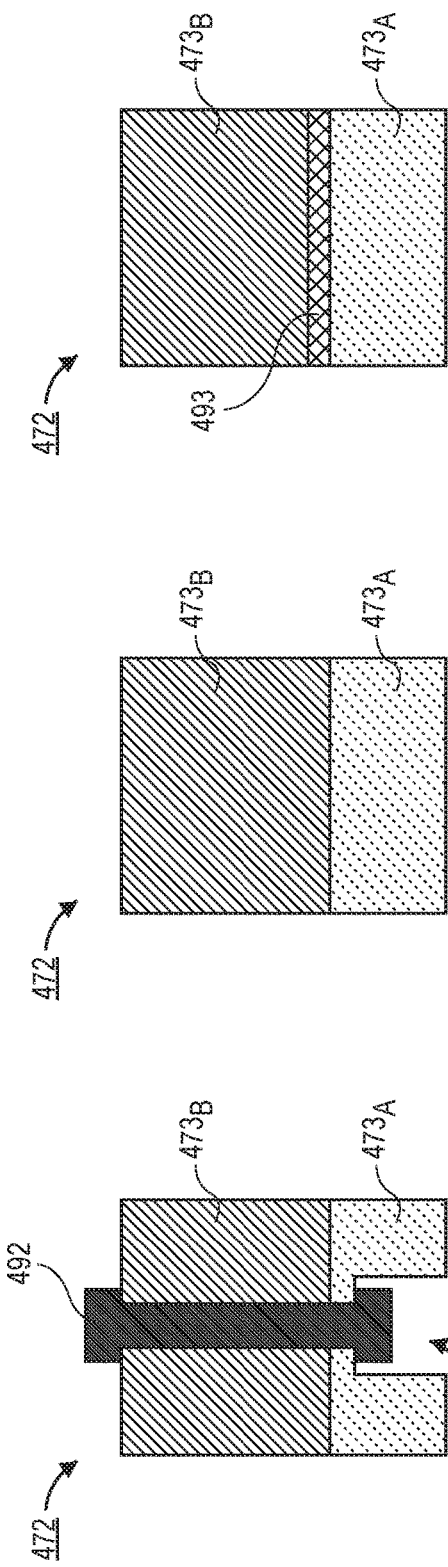

MODULAR MICROWAVE SOURCE WITH MULTIPLE METAL HOUSINGS

BACKGROUND

1) Field

Embodiments relate to the field of semiconductor manufacturing and, in particular, to monolithic source arrays for high-frequency plasma sources.

2) Description of Related Art

Some high-frequency plasma sources include applicators that pass through an opening in a dielectric plate. The opening through the dielectric plate allows for the applicator (e.g., a dielectric cavity resonator) to be exposed to the plasma environment. However, it has been shown that plasma is also generated in the opening in the dielectric plate in the space surrounding the applicator. In processing chambers where two dimensional plasma uniformity over a large area is desired, this construction may cause plasma non-uniformities within the processing chamber.

In some embodiments, the applicators are positioned over the dielectric plate or within a cavity into (but not through) the dielectric plate. Such configurations have reduced coupling with the interior of the chamber and, therefore, does not provide an optimum plasma generation. The coupling of the high-frequency electromagnetic radiation with the interior of the chamber is diminished in part due to the additional interface between the dielectric plate and the applicator across which the high-frequency electromagnetic radiation needs to propagate. Additionally, variations of the interface (e.g., positioning of the applicator, surface roughness of the applicator and/or the dielectric plate, angle of the applicator relative to the dielectric plate, etc.) at each applicator and across different processing tools may result in plasma non-uniformities.

Particularly, when the applicators are discrete components from the dielectric plate, plasma non-uniformity (within a single processing chamber and/or across different processing chambers (e.g., chamber matching)) is more likely to occur. For example, with discrete components, small variations (e.g., variations in assembly, machining tolerances, etc.) can result in plasma non-uniformities that negatively affect processing conditions within the chamber.

SUMMARY

Embodiments disclosed herein include a modular microwave source array. In an embodiment, a housing assembly for the source array comprises a first conductive layer, wherein the first conductive layer comprises a first coefficient of thermal expansion (CTE), and a second conductive layer over the first conductive layer, wherein the second conductive layer comprises a second CTE that is different than the first CTE. In an embodiment, the housing assembly further comprises a plurality of openings through the housing assembly, where each opening passes through the first conductive layer and the second conductive layer.

An additional embodiment includes an assembly that comprises a source array, where the source array comprises a dielectric plate and a plurality of dielectric resonators extending up from a surface of the dielectric plate. In an embodiment, the assembly further comprises a housing assembly over the source array. In an embodiment, the housing assembly comprises a first conductive layer over the surface of the dielectric plate, where the first conductive layer comprises a first coefficient of thermal expansion (CTE), and a second conductive layer over the first conductive layer, wherein the second conductive layer comprises a second CTE that is different than the first CTE. In an embodiment, the housing assembly further comprises a plurality of openings through the housing assembly, wherein each opening passes through the first conductive layer and the second conductive layer, and wherein each opening accommodates one of the plurality of dielectric resonators.

An additional embodiment includes a processing tool. The processing tool may comprise a chamber and an assembly interfacing with the chamber. In an embodiment, the assembly comprises a source array. In an embodiment, the source array comprises a dielectric plate having a first surface and a second surface opposite from the first surface, where the second surface is exposed to an interior volume of the chamber, and where the first surface is exposed to an exterior environment. The source array may further comprise a plurality of dielectric resonators that extend out from the first surface of the dielectric plate, where the plurality of dielectric resonators and the dielectric plate are a monolithic structure. In an embodiment, the assembly may further comprise a housing assembly over the monolithic source array. In an embodiment, the housing assembly may comprise a first conductive layer over the surface of the dielectric plate, where the first conductive layer comprises a first coefficient of thermal expansion (CTE), and a second conductive layer over the first conductive layer, where the second conductive layer comprises a second CTE that is different than the first CTE. In an embodiment, the housing assembly may further comprise a plurality of openings through the housing assembly, where each opening passes through the first conductive layer and the second conductive layer, and where each opening accommodates one of the plurality of dielectric resonators.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

BRIEF DESCRIPTION OF THE DRAWINGS

FIG. 4B is a cross-sectional illustration of an assembly after the monolithic source array and the housing are mated together, in accordance with an embodiment.

FIG. 4C is a cross-sectional illustration of a portion of the housing showing a first portion bolted to a second portion, in accordance with an embodiment.

FIG. 4D is a cross-sectional illustration of a portion of the housing showing a first portion bonded to a second portion, in accordance with an embodiment.

FIG. 4E is a cross-sectional illustration of a portion of the housing showing a first portion adhered to the second portion with an interface layer, in accordance with an embodiment.

DETAILED DESCRIPTION

Figure 1:
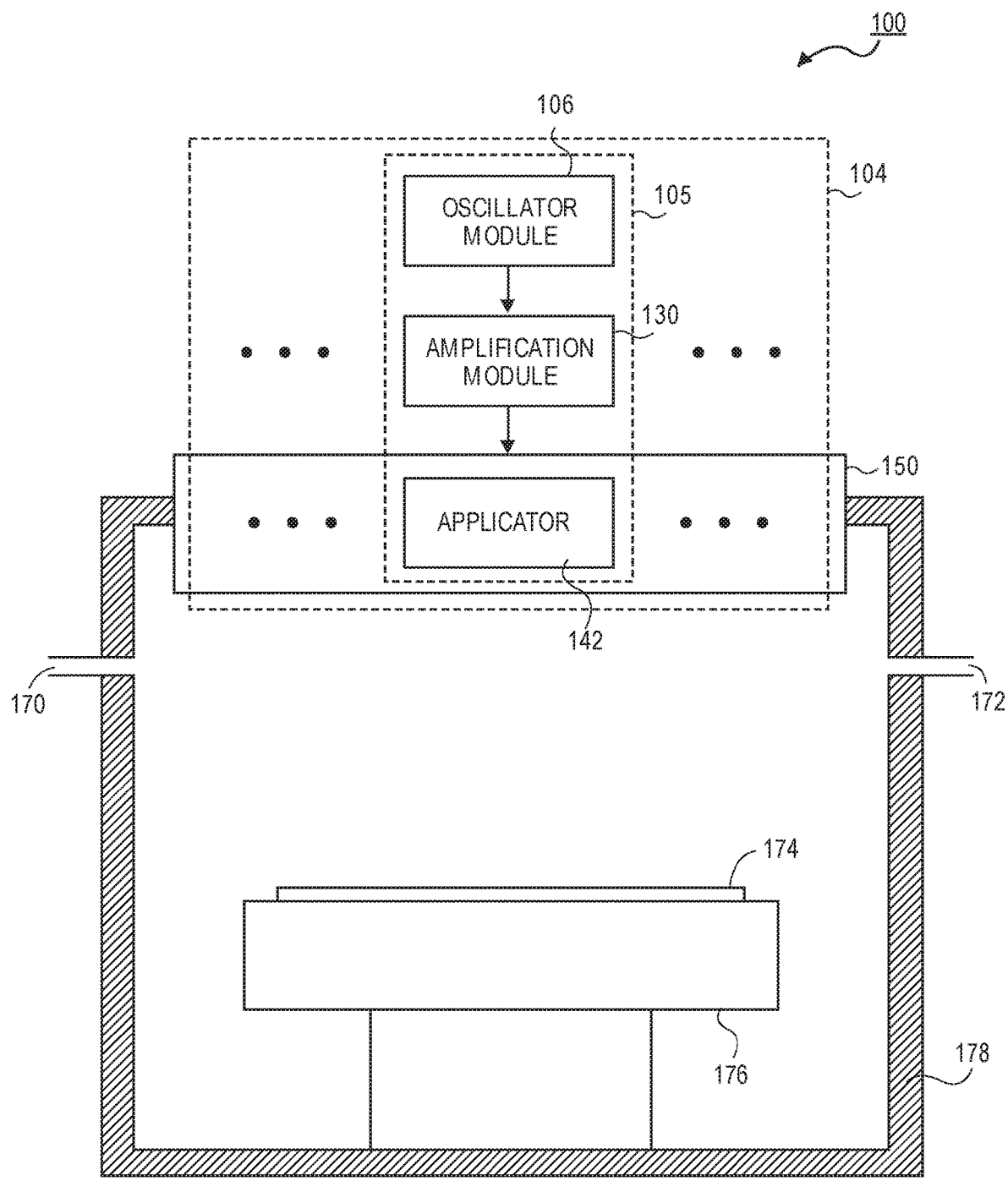
FIG. 1 is a schematic illustration of a processing tool that comprises a modular high-frequency emission source with a monolithic source array that comprises a plurality of applicators, in accordance with an embodiment.

Systems described herein include monolithic source arrays for high-frequency plasma sources. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, high-frequency plasma sources with discrete applicators may result in plasma non-uniformities within a chamber and in non-optimum injection of the high-frequency electromagnetic radiation into the chamber. The non-uniformities in the plasma may arise for different reasons, such as assembly issues, manufacturing tolerances, degradation, and the like. The non-optimum injection of the high-frequency electromagnetic radiation into the chamber may result (in part) from the interface between the applicator and the dielectric plate.

Accordingly, embodiments disclosed herein include a monolithic source array. In an embodiment, the monolithic source array comprises a dielectric plate and a plurality of protrusions that extend up from a surface of the dielectric plate. Particularly, the protrusions and the dielectric plate form a monolithic part. That is, the protrusions and the dielectric plate are fabricated from a single block of material. The protrusions have dimensions suitable for being used as the applicators. For example, holes into the protrusions may be fabricated that accommodate a monopole antenna. The protrusions may, therefore, function as a dielectric cavity resonator.

Implementing the source array as a monolithic part has several advantages. One benefit is that tight machining tolerances may be maintained in order to provide a high degree of uniformity between parts. Whereas discrete applicators need assembly, the monolithic source array avoids possible assembly variations. Additionally, the use of a monolithic source array provides improved injection of high-frequency electromagnetic radiation into the chamber, because there is no longer a physical interface between the applicator and the dielectric plate.

Monolithic source arrays also provide improved plasma uniformity in the chamber. Particularly, the surface of the dielectric plate that is exposed to the plasma does not include any gaps to accommodate the applicators. Furthermore, the lack of a physical interface between the protrusions and the dielectric plate improves lateral electric field spreading in the dielectric plate.

In some embodiments, the monolithic source array comprise a thin dielectric plate. While a thin plate allows for improved injection of high-frequency electromagnetic radiation into the chamber, a thin plate is also more susceptible to cracking. Particularly, stresses attributable to coefficient of thermal expansion (CTE) mismatch between materials of the monolithic source array and the conductive housing surrounding the monolithic source array may induce significant stress into the monolithic source array. For example, the monolithic source array may comprise aluminum oxide (which has a CTE of approximately 7 to 8 ppm), and the conductive housing may comprise aluminum (which has a CTE of approximately 22 ppm).

Accordingly, embodiments disclosed herein include a conductive housing that comprises a first conductive layer and a second conductive layer. The first conductive layer may interface with the dielectric plate of the monolithic source array, and the second conductive layer is over the first conductive layer. The first conductive layer may have a CTE that more closely matches the CTE of the monolithic source array. For example, the first conductive layer may comprise titanium (which has a CTE of approximately 8 ppm). The first conductive layer, therefore, provides a buffer between the second conductive layer and the monolithic source array and reduces thermal stress that is induced in the monolithic source array.

Referring now to FIG. 1, a cross-sectional illustration of a plasma processing tool 100 is shown, according to an embodiment. In some embodiments, the processing tool 100 may be a processing tool suitable for any type of processing operation that utilizes a plasma. For example, the processing tool 100 may be a processing tool used for plasma enhanced chemical vapor deposition (PECVD), plasma enhanced atomic layer deposition (PEALD), etch and selective removal processes, and plasma cleaning. Additional embodiments may include a processing tool 100 that utilizes high-frequency electromagnetic radiation without the generation of a plasma (e.g., microwave heating, etc.). As used herein, "high-frequency" electromagnetic radiation includes radio frequency radiation, very-high-frequency radiation, ultra-high-frequency radiation, and microwave radiation. "High-frequency" may refer to frequencies between 0.1 MHz and 300 GHz.

Generally, embodiments include a processing tool 100 that includes a chamber 178. In processing tools 100, the chamber 178 may be a vacuum chamber. A vacuum chamber may include a pump (not shown) for removing gases from the chamber to provide the desired vacuum. Additional embodiments may include a chamber 178 that includes one or more gas lines 170 for providing processing gasses into the chamber 178 and exhaust lines 172 for removing byproducts from the chamber 178. While not shown, it is to be appreciated that gas may also be injected into the chamber 178 through a monolithic source array 150 (e.g., as a showerhead) for evenly distributing the processing gases over a substrate 174.

In an embodiment, the substrate 174 may be supported on a chuck 176. For example, the chuck 176 may be any suitable chuck, such as an electrostatic chuck. The chuck 176 may also include cooling lines and/or a heater to provide temperature control to the substrate 174 during processing. Due to the modular configuration of the high-frequency emission modules described herein, embodiments allow for the processing tool 100 to accommodate any sized substrate 174. For example, the substrate 174 may be a semiconductor wafer (e.g., 200 mm, 300 mm, 450 mm, or larger). Alternative embodiments also include substrates 174 other than semiconductor wafers. For example, embodiments may include a processing tool 100 configured for processing glass substrates, (e.g., for display technologies).

According to an embodiment, the processing tool 100 includes a modular high-frequency emission source 104. The modular high-frequency emission source 104 may comprise an array of high-frequency emission modules 105. In an embodiment, each high-frequency emission module 105 may include an oscillator module 106, an amplification module 130, and an applicator 142. As shown, the applicators 142 are schematically shown as being integrated into the monolithic source array 150. However, it is to be appreciated that the monolithic source array 150 may be a monolithic structure that comprises one or more portions of the applicator 142 (e.g., a dielectric resonating body) and a dielectric plate that faces the interior of the chamber 178.

In an embodiment, the oscillator module 106 and the amplification module 130 may comprise electrical components that are solid state electrical components. In an embodiment, each of the plurality of oscillator modules 106 may be communicatively coupled to different amplification modules 130. In some embodiments, there may be a 1:1 ratio between oscillator modules 106 and amplification modules 130. For example, each oscillator module 106 may be electrically coupled to a single amplification module 130. In an embodiment, the plurality of oscillator modules 106 may generate incoherent electromagnetic radiation. Accordingly, the electromagnetic radiation induced in the chamber 178 will not interact in a manner that results in an undesirable interference pattern.

In an embodiment, each oscillator module 106 generates high-frequency electromagnetic radiation that is transmitted to the amplification module 130. After processing by the amplification module 130, the electromagnetic radiation is transmitted to the applicator 142. In an embodiment, the applicators 142 each emit electromagnetic radiation into the chamber 178. In some embodiments, the applicators 142 couple the electromagnetic radiation to the processing gasses in the chamber 178 to produce a plasma.

Figure 2:
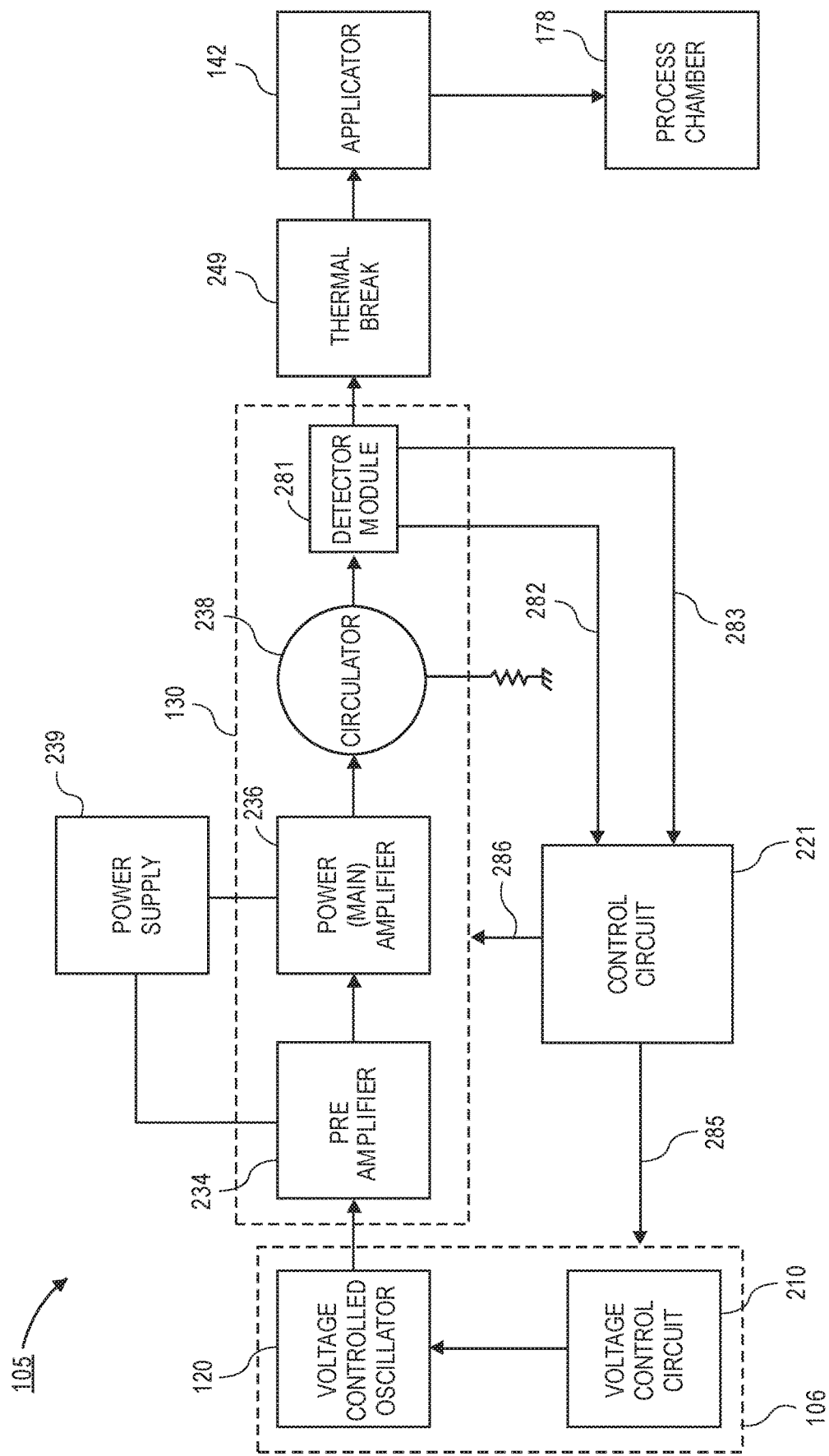
FIG. 2 is a block diagram of a modular high-frequency emission module, in accordance with an embodiment.

Referring now to FIG. 2, a schematic of a solid state high-frequency emission module 105 is shown, in accordance with an embodiment. In an embodiment, the high-frequency emission module 105 comprises an oscillator module 106. The oscillator module 106 may include a voltage control circuit 210 for providing an input voltage to a voltage controlled oscillator 220 in order to produce high-frequency electromagnetic radiation at a desired frequency. Embodiments may include an input voltage between approximately 1V and 10V DC. The voltage controlled oscillator 220 is an electronic oscillator whose oscillation frequency is controlled by the input voltage. According to an embodiment, the input voltage from the voltage control circuit 210 results in the voltage controlled oscillator 220 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 220 to an amplification module 130. The amplification module 130 may include a driver/pre-amplifier 234, and a main power amplifier 236 that are each coupled to a power supply 239. According to an embodiment, the amplification module 130 may operate in a pulse mode. For example, the amplification module 130 may have a duty cycle between 1% and 99%. In a more particular embodiment, the amplification module 130 may have a duty cycle between approximately 15% and 50%.

In an embodiment, the electromagnetic radiation may be transmitted to the thermal break 249 and the applicator 142 after being processed by the amplification module 130. However, part of the power transmitted to the thermal break 249 may be reflected back due to the mismatch in the output impedance. Accordingly, some embodiments include a detector module 281 that allows for the level of forward power 283 and reflected power 282 to be sensed and fed back to the control circuit module 221. It is to be appreciated that the detector module 281 may be located at one or more different locations in the system (e.g., between the circulator 238 and the thermal break 249). In an embodiment, the control circuit module 221 interprets the forward power 283 and the reflected power 282, and determines the level for the control signal 285 that is communicatively coupled to the oscillator module 106 and the level for the control signal 286 that is communicatively coupled to the amplification module 130. In an embodiment, control signal 285 adjusts the oscillator module 106 to optimize the high-frequency radiation coupled to the amplification module 130. In an embodiment, control signal 286 adjusts the amplification module 130 to optimize the output power coupled to the applicator 142 through the thermal break 249. In an embodiment, the feedback control of the oscillator module 106 and the amplification module 130, in addition to the tailoring of the impedance matching in the thermal break 249 may allow for the level of the reflected power to be less than approximately 5% of the forward power. In some embodiments, the feedback control of the oscillator module 106 and the amplification module 130 may allow for the level of the reflected power to be less than approximately 2% of the forward power.

Accordingly, embodiments allow for an increased percentage of the forward power to be coupled into the processing chamber 178, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 220.

Figure 3A:
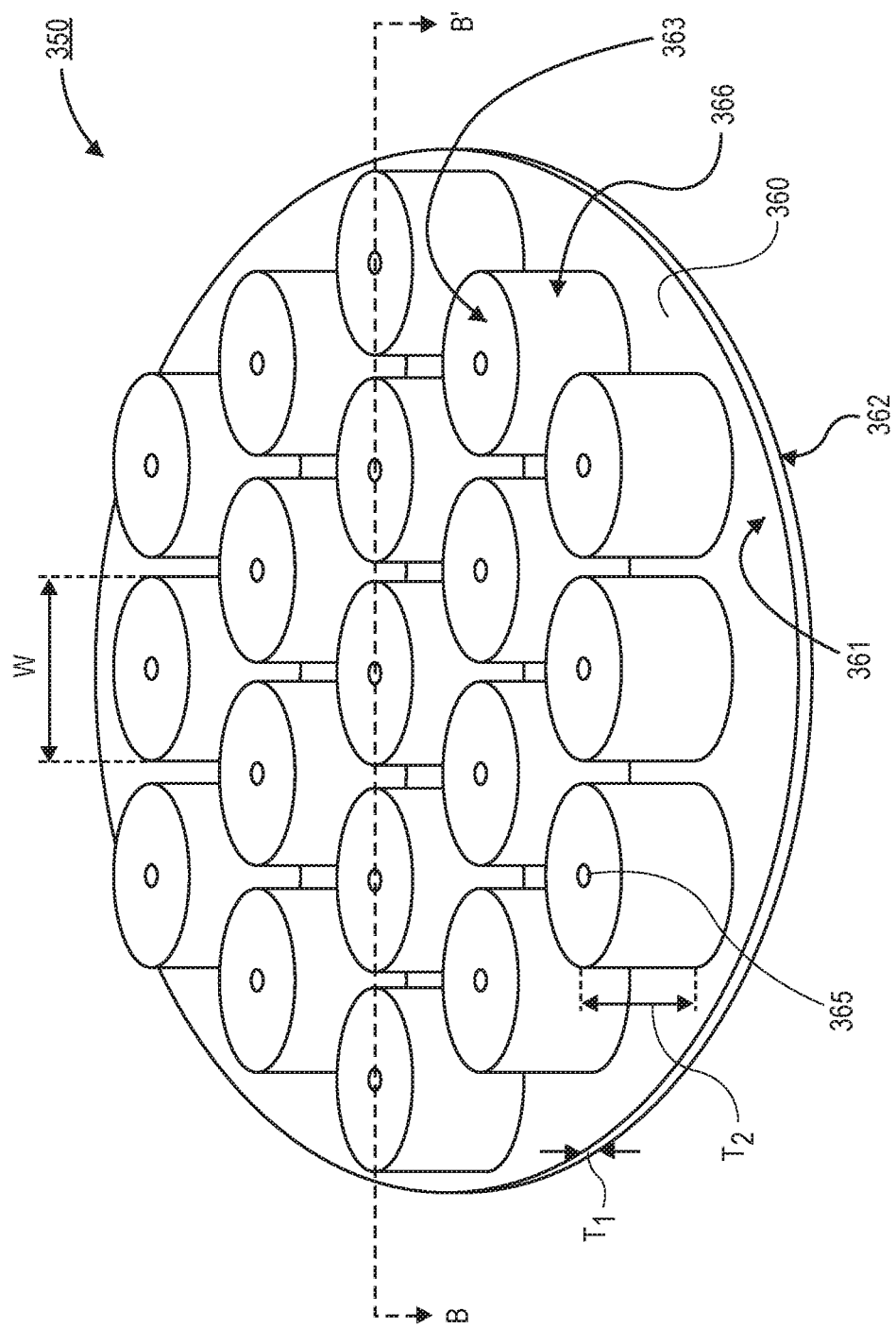
FIG. 3A is a perspective view illustration of a monolithic source array that comprises a plurality of applicators and a dielectric plate, in accordance with an embodiment.

Referring now to FIG. 3A, a perspective view illustration of a monolithic source array 350 is shown, in accordance with an embodiment. In an embodiment, the monolithic source array 350 comprises a dielectric plate 360 and a plurality of protrusions 366 that extend up from the dielectric plate 360. In an embodiment, the dielectric plate 360 and the plurality of protrusions 366 are a monolithic structure. That is, there is no physical interface between a bottom of the protrusions 366 and a first surface 361 of the dielectric plate 360. As used herein, a "physical interface" refers to a first surface of a first discrete body contacting a second surface of a second discrete body. However, in other embodiments, the protrusions 366 may be discrete resonators that have a physical interface with the dielectric plate 360.

Each of the protrusions 366 are a portion of an applicator 142 used to inject high-frequency electromagnetic radiation into a processing chamber 178. Particularly, the protrusions 366 function as the resonating body of the applicator 142. Other components of the applicator 142 (e.g., the monopole antenna and the grounded housing surrounding the resonating body) may be discrete components from the monolithic source array 350 and are described in greater detail below.

The dielectric plate 360 comprises a first surface 361 and a second surface 362 opposite from the first surface 361. The dielectric plate has a first thickness $T_1$ between the first surface 361 and the second surface 362. In an embodiment, the first thickness $T_1$ is less than approximately 30 mm, less than approximately 20 mm, less than approximately 10 mm, or less than approximately 5 mm. In a particular embodiment, the first thickness $T_1$ is approximately 3 mm. Decreasing the first thickness $T_1$ provides improved coupling of high-frequency electromagnetic radiation into the processing chamber. It is to be appreciated that decreases in the thickness $T_1$ reduce the mechanical integrity of the dielectric plate 360. Particularly, the dielectric plate 360 is more susceptible to cracking as a result of thermal stresses from the system. However, embodiments disclosed herein comprise a conductive housing (described in greater detail below) that includes a first conductive layer that has a CTE closely matched to the CTE of the dielectric plate 360. As such, thermal stresses are reduced and thin dielectric plates 360 such as those described above are able to be used. In the illustrated embodiment, the dielectric plate 360 is shown with a substantially circular shape. However, it is to be appreciated that the dielectric plate 360 may have any desired shape (e.g., polygonal, elliptical, wedge shaped, or the like).

The plurality of protrusions 366 extend up from the first surface 361 of the dielectric plate 360. For example, sidewalls 364 are oriented substantially perpendicular to the first surface 361 of the dielectric plate 360. The protrusions 366 further comprise a third surface 363. The third surface 363 may be substantially parallel to the first surface 361. In an embodiment, a hole 365 is disposed into the third surface 363 of each protrusion. The hole 365 is sized to accommodate a monopole antenna of the applicator 142. In an embodiment, the hole 365 is positioned at the axial center of the protrusion 366.

In an embodiment, the protrusions 366 may have a second thickness $T_2$ between the first surface 361 and the third surface 363. In an embodiment, the second thickness $T_2$ may be chosen to provide a resonating body for the applicator. For example, the dimensions of the protrusions 366 may depend on at least the material of the monolithic source array, the thickness of the dielectric plate 360, and the desired operating frequency, among other considerations. Embodiments may generally include decreasing the second thickness $T_2$ of the protrusion as the first thickness $T_1$ of the dielectric plate increases.

In an embodiment, the plurality of protrusions 366 are arranged in an array. In the illustrated embodiment, the plurality of protrusions 366 are arranged in a close-packed array, though other packing arrangements are possible. Furthermore, while nineteen protrusions 366 are shown, it is to be appreciated that embodiments may include one or more protrusions 366 extending away from the first surface 361 of the dielectric plate 360. In the illustrated embodiment, each of the protrusions 366 have the same dimensions (e.g., thickness $T_2$ and width W). In other embodiments, the dimensions of the protrusions 366 may be non-uniform.

In an embodiment, the monolithic source array 350 comprises a dielectric material. For example, the monolithic source array 350 may be a ceramic material. In an embodiment, one suitable ceramic material that may be used for the monolithic source array 350 is $Al_2O_3$. The monolithic structure may be fabricated from a single block of material. In other embodiments, a rough shape of the monolithic source array 350 may be formed with a molding process, and subsequently machined to provide the final structure with the desired dimensions. For example, green state machining and firing may be used to provide the desired shape of the monolithic source array 350.

Figure 3B:
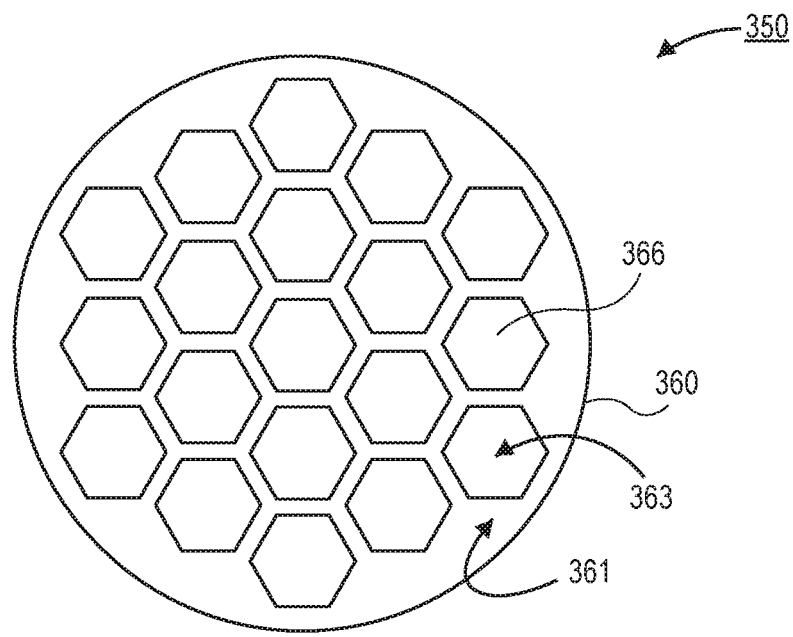
FIG. 3B is a plan view illustration of a monolithic source array with a plurality of applicators that are hexagonal in shape, in accordance with an embodiment.

Referring now to FIG. 3B, a plan view illustration of a monolithic source array 350 is shown in accordance with an additional embodiment. The monolithic source array 350 is substantially similar to the monolithic source array 350 in FIG. 3A, with the exception that the protrusions 366 have a different cross section as viewed along a plane parallel to the first surface 361. In FIG. 3B, the outlines of the protrusions 366 are substantially hexagonal in shape, as opposed to being circular in FIG. 3A. While examples of circular and hexagonal cross-sections are shown, it is to be appreciated that the protrusions 366 may comprise many different cross-sections. For example, the cross-section of the protrusions 366 may have any shape that is centrally symmetric.

Figure 4A:
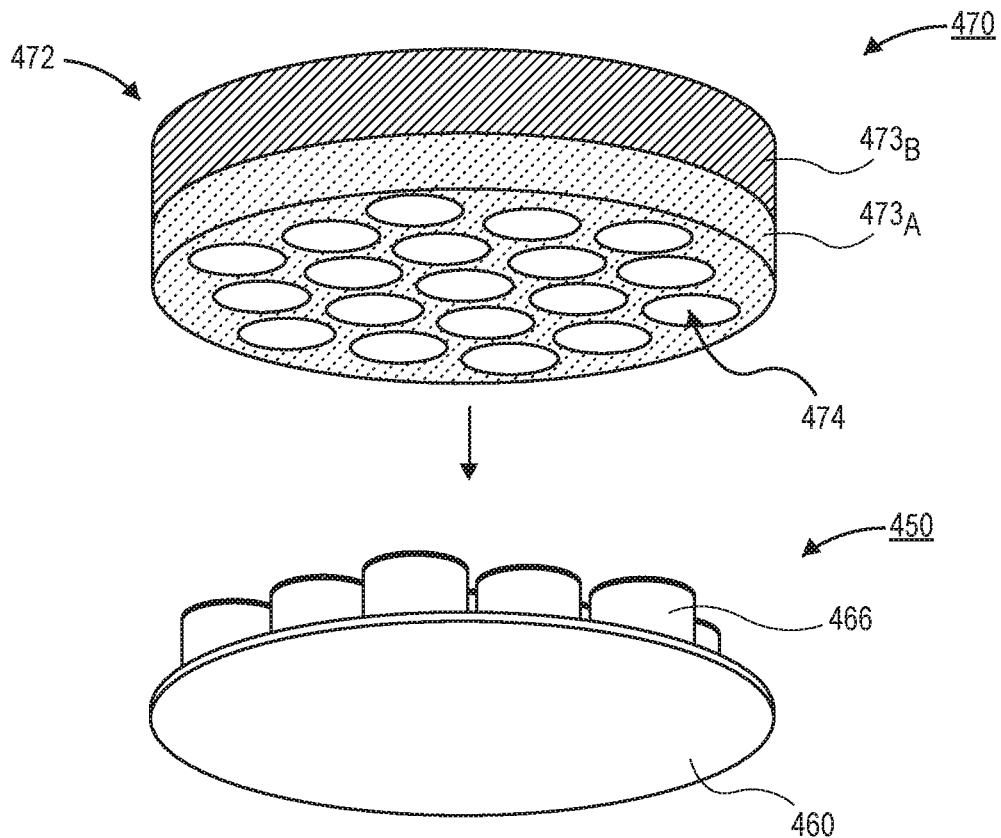
FIG. 4A is a perspective view illustration of a monolithic source array and a housing that interfaces with the monolithic source array to form an assembly, in accordance with an embodiment.

Referring now to FIG. 4A, an exploded view of an assembly 470 is shown, in accordance with an embodiment. In an embodiment, the assembly 470 comprises a monolithic source array 450 and a housing 472. The monolithic source array 450 may be substantially similar to the monolithic source array 350 described above. For example, the monolithic source array 450 may comprise a dielectric plate 460 and a plurality of protrusions 466 that extend up from the dielectric plate 460.

In an embodiment, the housing 472 comprises a multi-layer conductive body. For example, the housing 472 may comprise a first conductive layer $473_A$ and a second conductive layer $473_B$ over the first conductive layer $473_A$. The first conductive layer $473_A$ comprises a first material and the second conductive layer $473_B$ comprises a second material that is different than the first material. Particularly, the first material has a first CTE that is smaller than a second CTE of the second material. In an embodiment, the first CTE may be closely matched to a third CTE of the monolithic source array 450. That is, a difference between the first CTE and the third CTE may be smaller than a difference between the second CTE and the third CTE. For example, the first conductive layer $473_A$ may comprise titanium and the second conductive layer $473_B$ may comprise aluminum. In an embodiment, the first conductive layer $473_A$ and second conductive layer $473_B$ may be individually grounded. In other embodiments, the first conductive layer $473_A$ and second conductive layer $473_B$ may be joined mechanically or by any form of metallic bonding, to form a single electrically conductive body 473 that is held at a substantially uniform ground potential.

In an embodiment, the housing 472 comprises a plurality of openings 474. The openings 474 may pass entirely through a thickness of the first conductive layer 473$_A$ and the second conductive layer 473$_B$. The openings 474 may be sized to receive the protrusions 466. For example, as the housing 472 is displaced towards the monolithic source array 450 (as indicated by the arrow) the protrusions 466 will be inserted into the openings 474.

Referring now to FIG. 4B, a cross-sectional illustration of the assembly 470 is shown, in accordance with an embodiment. As shown, the first conductive layer 473$_A$ of the housing 472 is supported by the first surface 461 of the dielectric plate 460. In the illustrated embodiment, the first conductive layer 473$_A$ is directly supported by the first surface 461, but it is to be appreciated that a thermal interface material or the like may separate the first conductive layer 473$_A$ from the first surface 461. In an embodiment, the second surface 462 of the dielectric plate 460 faces away from the housing 472.

In an embodiment, the housing 472 has a third thickness $T_3$. The third thickness $T_3$ of the housing 472 may be similar to the second thickness $T_2$ of the protrusions 466. In other embodiments, the third thickness $T_3$ of the housing 472 may be larger or smaller than the second thickness $T_2$ of the protrusions 466. In the illustrated embodiment, a thickness of the first conductive layer 473$_A$ is smaller than a thickness of the second conductive layer 473$_B$. In some embodiments, the first conductive layer 473$_A$ may have a thickness that is approximately one-half or less, one-quarter or less, or one-eighth or less the thickness of the second conductive layer 473$_B$. However, it is to be appreciated that the thickness of the first conductive layer 473$_A$ may be equal to or greater than a thickness of the second conductive layer 473$_B$ in other embodiments.

In the illustrated embodiment, the openings 474 have an opening diameter O that is greater than the width W of the protrusions 466. The difference in the dimensions results in a gap 475 between sidewalls of the protrusions 466 and the sidewalls of the conductive body 473. The gap 475 may be suitable to allow for some degree of thermal expansion while still maintaining a secure fit between the monolithic source array 450 and the housing 472. In some embodiments, the housing 472 is mechanically coupled to the monolithic source array 450.

As will be shown in more detail below, different surfaces of the assembly 470 will be exposed to different environments. For example, the second surface 462 is configured to be exposed to a chamber volume. The opposite side of the assembly 470 is configured to be exposed to the atmosphere or other environments with pressures higher than that of the chamber volume during operation (e.g., approximately 1.0 atm or higher). Accordingly, the small gaps 475 between the conductive body 473 and the protrusions 466 will not experience a low pressure environment suitable for igniting a plasma.

Referring now to FIGS. 4C-4E, a series of cross-sectional illustrations depicting different interfaces between the first conductive layer 473$_A$ and the second conductive layer 473$_B$ of the housing 472 are shown, in accordance with various embodiments.

Referring now to FIG. 4C, a cross-sectional illustration of a first conductive layer 473$_A$ that is mechanically coupled to the second conductive layer 473$_B$ by a fastener 492 is shown, in accordance with an embodiment. In an embodiment, the fastener 492 is a bolt or the like. The bolt may be inserted into a recesses 491 into the first conductive layer 473$_A$ and pass through the second conductive layer 473$_B$.

Referring now to FIG. 4D, a cross-sectional illustration of a first conductive layer 473$_A$ that is mechanically coupled to the second conductive layer 473$_B$ by a mechanical bond at the interface is shown, in accordance with an embodiment. For example, the mechanical bond may be formed using a diffusion bonding process, or the like. In such embodiments, there may be no need for an external fastener 492.

Referring now to FIG. 4E, a cross-sectional illustration of a first conductive layer 473$_A$ that is mechanically coupled to the second conductive layer 473$_B$ by an interface layer 493 is shown, in accordance with an embodiment. In an embodiment, the interface layer 493 may be an adhesive. The adhesive may be a conductive adhesive. In other embodiments, the interface layer 493 may be an insulating adhesive, and the first conductive layer 473$_A$ and the second conductive layer 473$_B$ may be separately grounded. In some embodiments, the interface layer 493 may function as an electrical gasket to improve electrical coupling between the first conductive layer 473$_A$ and the second conductive layer 473$_B$.

Figure 4F:
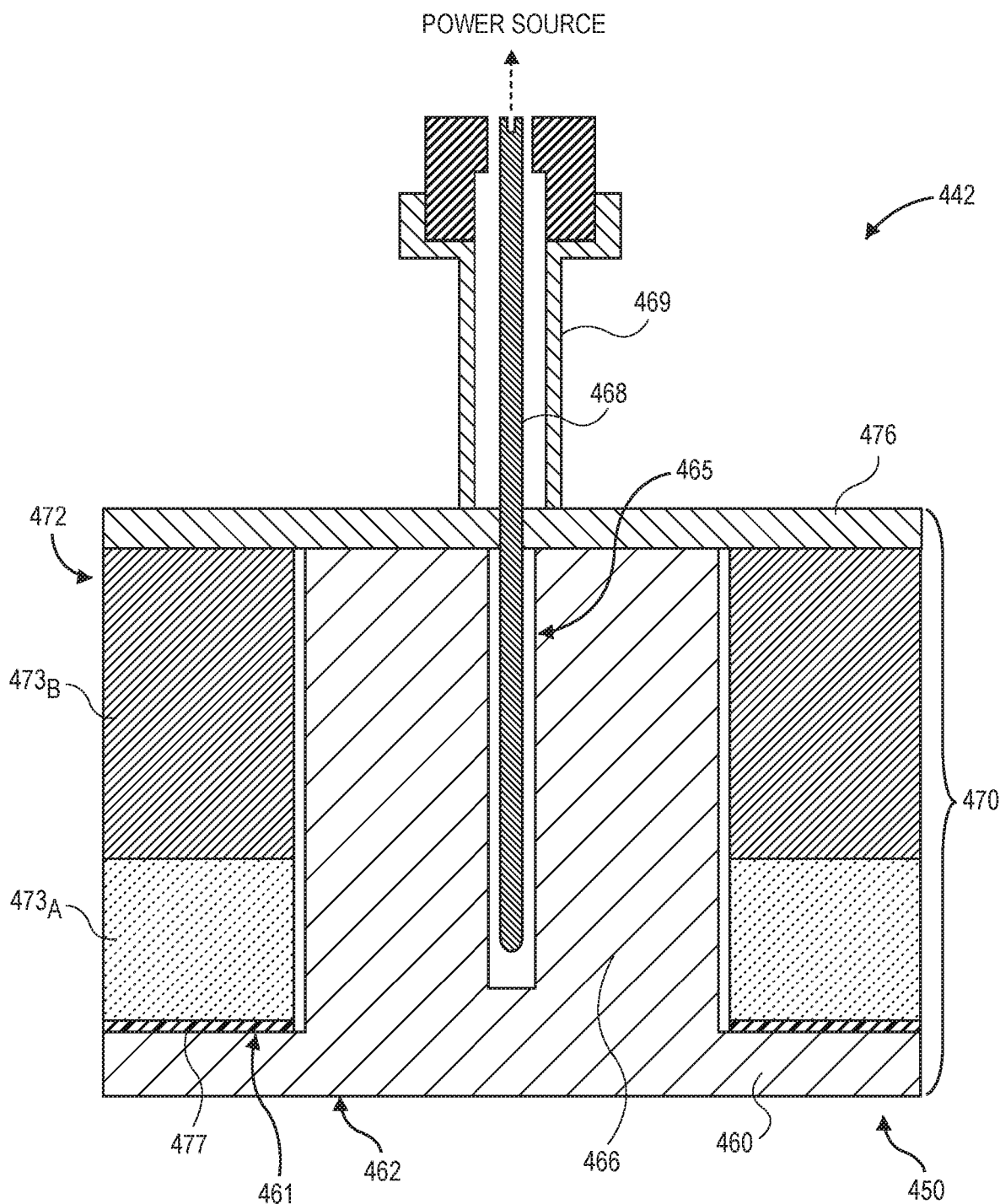
FIG. 4F is a cross-sectional illustration of an applicator that comprises components from the assembly, in accordance with an embodiment.

Referring now to FIG. 4F, a cross-sectional illustration of an applicator 442 that is integrated with the assembly 470 is shown, in accordance with an embodiment. In an embodiment, the applicator 442 comprises the protrusion 466, the housing 472 surrounding the protrusion 466, and the monopole antenna 468 extending into the hole 465. In an embodiment, a conductive plate 476 may also cover a top surface of the protrusion 466. Accordingly, portions of the assembly 470 may be used as components of the applicator 442. For example, the protrusion 466 is part of the monolithic source array 450 and functions as the dielectric cavity resonator of the applicator 442, and the first conductive layer 473$_A$ and the second conductive layer 473$_B$ are part of the housing 472 and function as the ground plane surrounding the dielectric cavity resonator for the applicator 442.

The monopole antenna 468 may be surrounded by shielding 469 above the assembly 470, and the monopole antenna 468 may be electrically coupled to a high-frequency power source (e.g., a high-frequency emission module 105 or the like). The monopole antenna 468 passes through conductive plate 476 and extends into the hole 465. In some embodiments, the hole 465 extends deeper into the protrusion 466 than the monopole antenna 468. Additionally, the width of the hole 465 may be greater than the width of the monopole antenna 468. Accordingly, tolerances for thermal expansion are provided in some embodiments in order to prevent damage to the monolithic source array 450. Also shown in FIG. 4F is a thermal interface material 477 between a bottom surface of the conductive body 473 and the first surface 461 of the dielectric plate 460. A thermal interface material 477 may improve heat transfer between the conductive body 473 and the dielectric plate 460 when active heating or cooling is implemented in the assembly 470.

In some embodiments, the housing 472 may further comprise a gas distribution network and/or fluidic channels for active heating and/or cooling. Embodiments that depict such structures integrated with a multi-layer housing 472 are shown in FIGS. 5 and 6.

Figure 5:
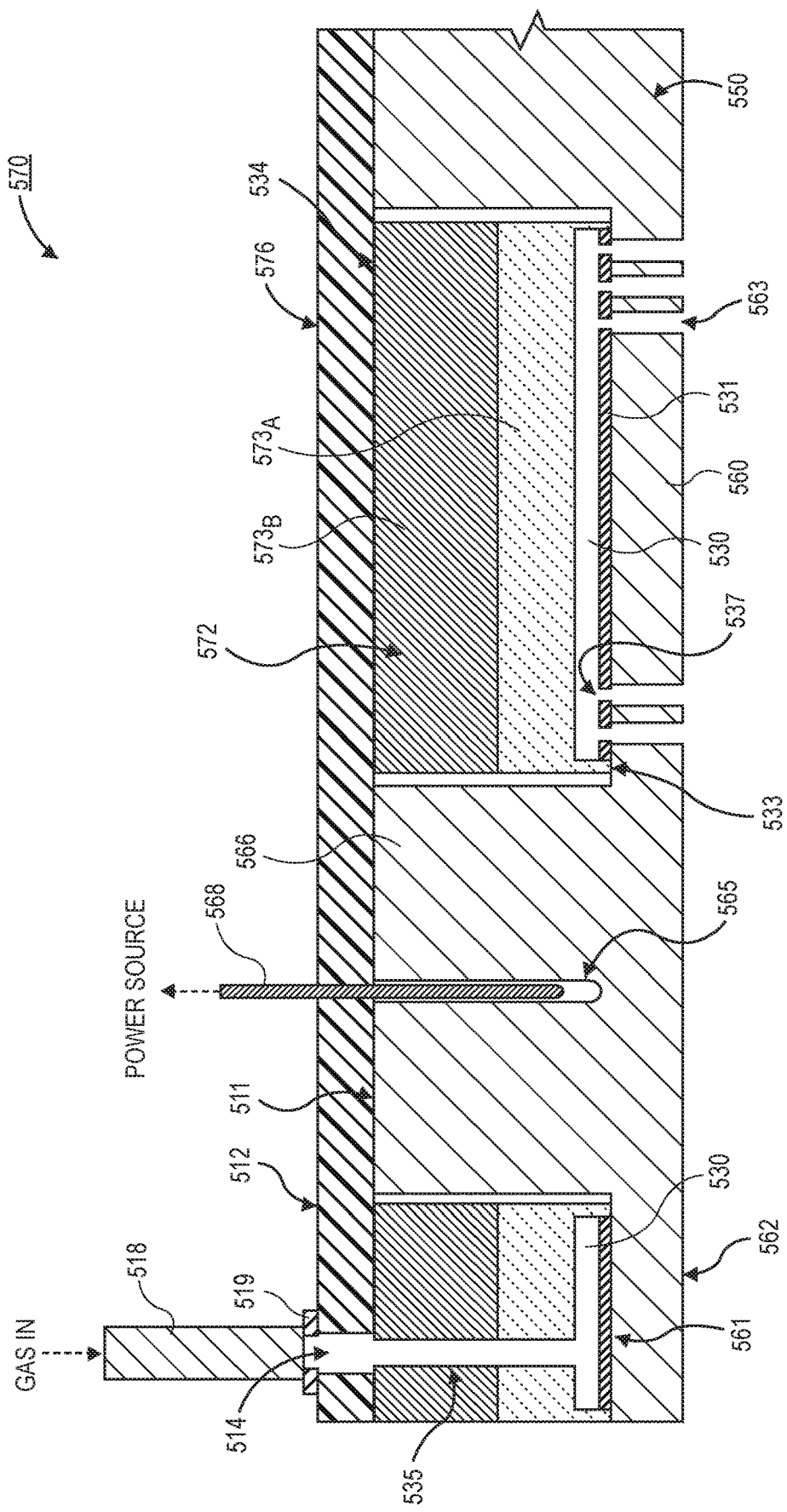
FIG. 5 is a cross-sectional illustration of an assembly that comprises a gas distribution network in the second portion of the housing, in accordance with an embodiment.
Figure 6:
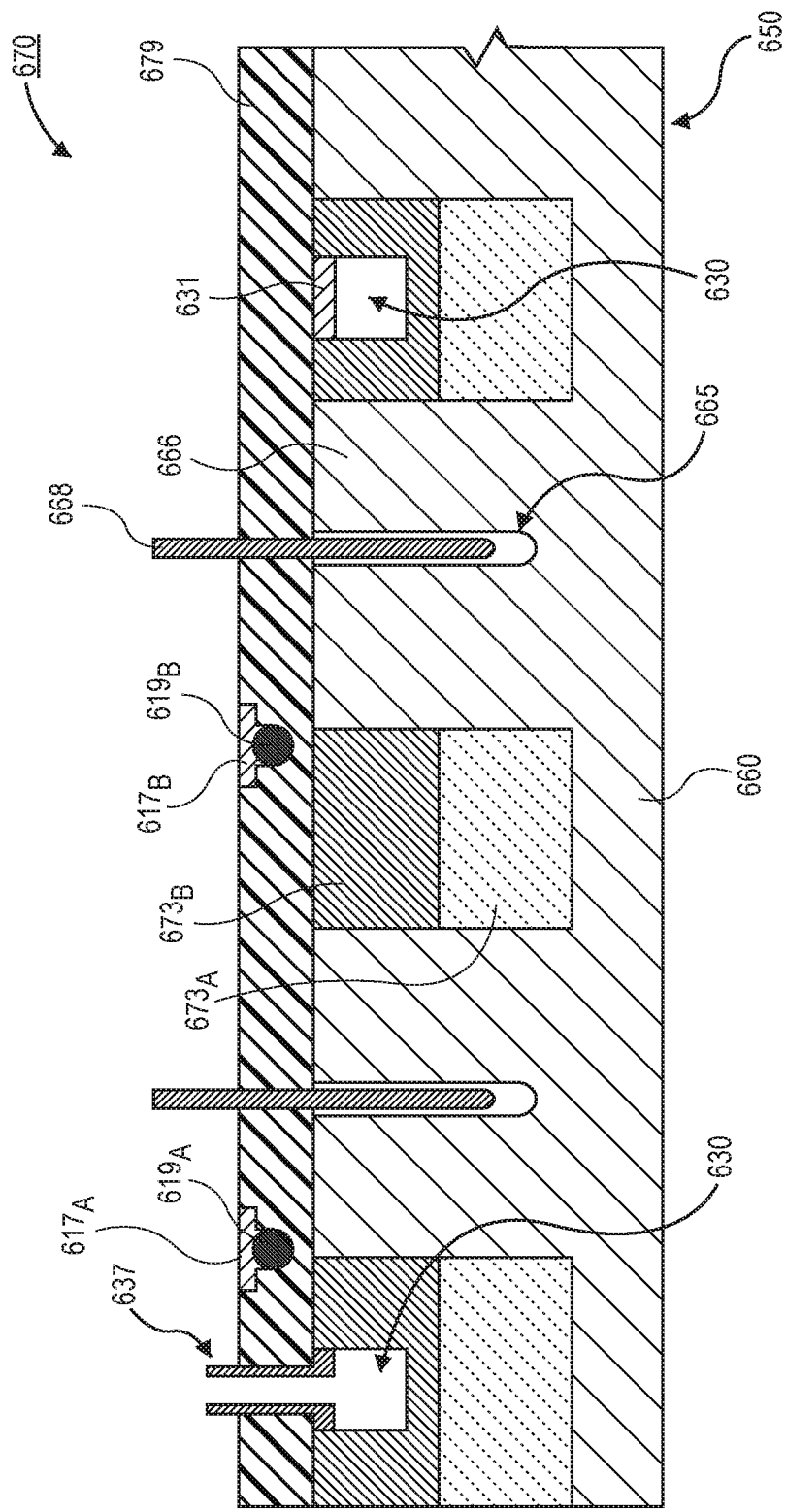
FIG. 6 is a cross-sectional illustration of an assembly that comprises fluidic channels in the first portion of the housing, in accordance with an embodiment.

Referring now to FIG. 5, a cross-sectional illustration of a portion of the assembly 570 is shown, in accordance with an embodiment. The assembly 570 comprises a monolithic source array 550, a housing 572, and a lid plate 576.

In an embodiment, a surface 533 of the first conductive layer 573$_A$ is supported by the first surface 561 of the dielectric plate 560. In an embodiment, the second surface 562 of the dielectric plate 560 faces away from the housing 572. The protrusions 566 of the monolithic source array 550 fit into openings in the housing 572. In an embodiment, the lid plate 576 covers the housing 572 and the protrusions 566. For example, a second surface 511 of the lid plate 576 covers the surface 534 of the housing 572. A monopole antenna 568 may pass through the lid plate 576 and extend into a hole 565 in the axial center of the protrusion 566. The width of the hole 565 may be greater than the width of the monopole antenna 568. The monopole antenna 568 is electrically coupled to a power source (e.g., a high-frequency emission module 105).

In an embodiment, the gas distribution network passes through the components of the assembly 570. The gas is initially fed into the assembly 570 by a gas line 518. The gas line 518 is coupled to the first surface 512 of the lid plate 576 by a coupler 519. An O-ring (not shown) may be positioned between the coupler 519 and the first surface 512. Processing gasses then travel through a hole 514 that passes through the lid plate 576. The gas distribution continues with a hole 535 that passes through the second conductive layer $573_B$ and the first conductive layer $573_A$ of the housing 572. In an embodiment, an O-ring or the like (not shown) may surround the interface between the hole 514 and the hole 535 to provide a seal.

As shown, the hole 535 intersects with channel 530 in the first conductive layer $573_A$. The channel 530 laterally distributes the processing gas. The channel 530 is sealed by a cover 531, and gas is distributed out of the housing 572 by passing through groups of holes 537 in the cover 531. In an embodiment, the gas then flows through holes 563 through the dielectric plate 560. The holes 563 may be aligned with the holes 537 in the groups 532. In an embodiment, the holes 563 through the dielectric plate 560 have a diameter that is larger than the diameter of the holes 537 through the cover 531. In an embodiment, an O-ring or the like (not shown) surrounds the interface between the holes 537 in the cover 531 and the holes 563 through the dielectric plate 560. In the illustrated embodiment, the channel 530 is shown as being entirely within the first conductive layer $573_A$. However, it is to be appreciated that some portion or all of the channel 530 may be positioned in the second conductive layer $573_B$ in other embodiments.

Referring now to FIG. 6, a cross-sectional illustration of an assembly 670 is shown in accordance with an embodiment. The illustrated embodiment depicts the monolithic source array 650, the housing 672, and the lid plate 676. In an embodiment, the housing 672 is supported by the dielectric plate 660 and wraps around the protrusions 666. The housing 672 may comprise a first conductive layer $673_A$ and a second conductive layer $673_B$. The second conductive layer $673_B$ of the housing 672 comprises a channel 630 that is sealed by a cover 631. The lid plate 676 rests over the housing 672 and the protrusions 666. In an embodiment, a monopole antenna 668 may pass through the lid plate 676 and fit into a hole 665 into the protrusion 666 below the lid plate 676.

In an embodiment, a stem 637 passes through the conductive body 679 of the lid plate 676. The stem 637 may be fluidically coupled to a source of thermal fluid (not shown). A second stem 637 (out of the plane of FIG. 6) may be an outlet for the thermal fluid that flows through the channel 630. In an embodiment, the lid plate 676 may comprise one or more heating elements 619. For example, an outer heating element $619_A$ and an inner heating element $619_B$ are shown in trenches into conductive body 679. The heating elements 619 may be covered by covers $617_A$, $617_B$. In the illustrated embodiment, the channel 630 is shown as being entirely within the second conductive layer $673_B$. However, it is to be appreciated that some portion or all of the channel 630 may be positioned in the first conductive layer $673_A$ in other embodiments.

Figure 7:
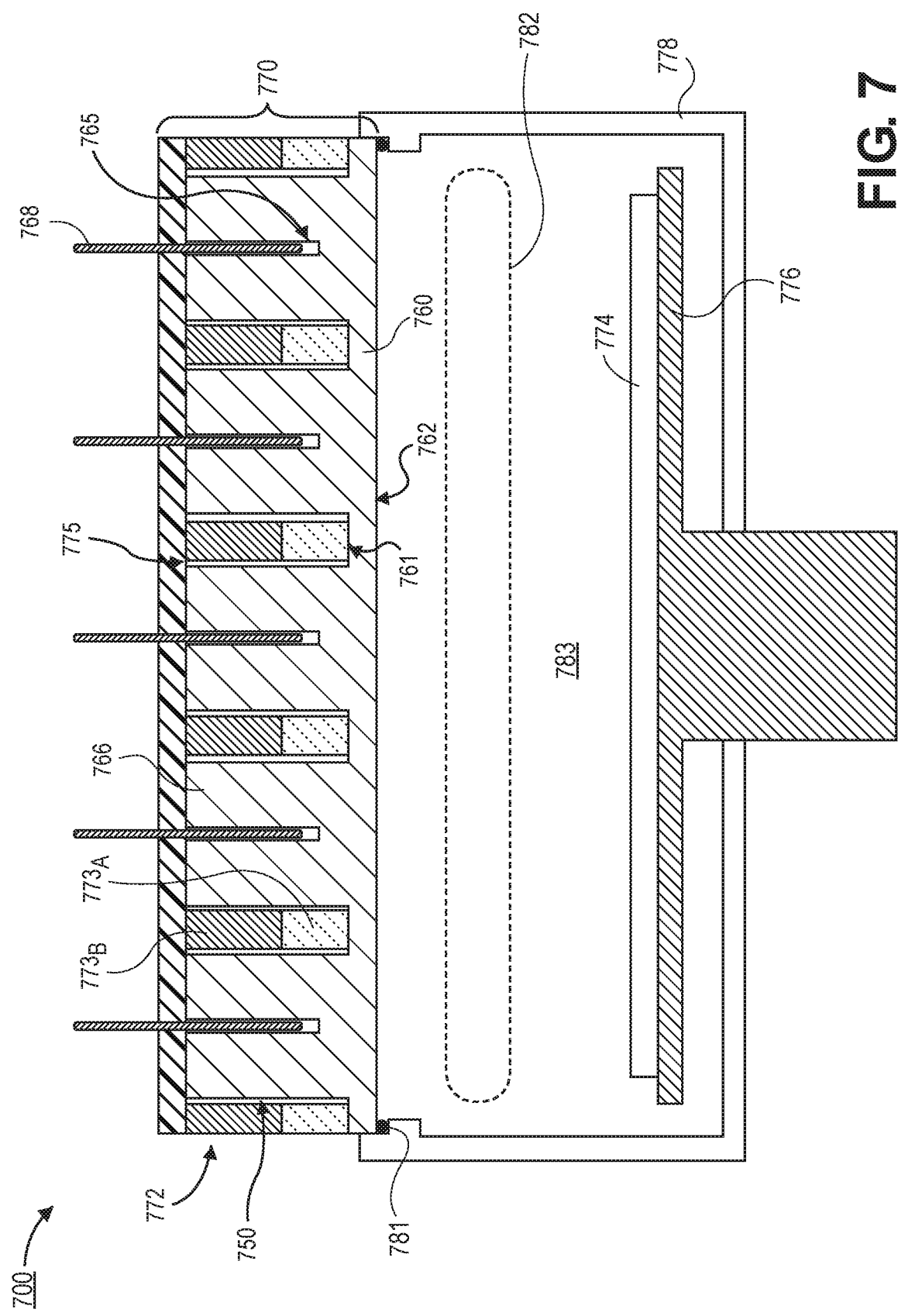
FIG. 7 is a cross-sectional illustration of a processing tool that comprises an assembly that includes a monolithic source array and a housing, in accordance with an embodiment.

Referring now to FIG. 7, a cross-sectional illustration of a processing tool 700 that includes an assembly 770 is shown, in accordance with an embodiment. In an embodiment, the processing tool comprises a chamber 778 that is sealed by an assembly 770. For example, the assembly 770 may rest against one or more O-rings 781 to provide a vacuum seal to an interior volume 783 of the chamber 778. In other embodiments, the assembly 770 may interface with the chamber 778. That is, the assembly 770 may be part of a lid that seals the chamber 778. In an embodiment, the processing tool 700 may comprise a plurality of processing volumes (which may be fluidically coupled together), with each processing volume having a different assembly 770. In an embodiment, a chuck 779 or the like may support a workpiece 774 (e.g., wafer, substrate, etc.).

In an embodiment, the assembly 770 may be substantially similar to the assembly 470 described above. For example, the assembly 770 comprises a monolithic source array 750 and a housing 772. The monolithic source array 750 may comprise a dielectric plate 760 and a plurality of protrusions 766 extending up from a first surface 761 of the dielectric plate 760. A second surface 762 of the dielectric plate 760 may be exposed to the interior volume 783 of the chamber 778. The housing 772 may having openings sized to receive the protrusions 766. In some embodiments gaps 775 may be provided between the protrusions 766 and the conductive body 773 of the housing 772 to allow for thermal expansion. In an embodiment, the housing 772 may comprise a first conductive layer 773A and a second conductive layer 773B. In an embodiment, monopole antennas 768 may extend into holes 765 in the protrusions 766. The monopole antennas 768 may pass through a top plate 776 over the housing 772 and the protrusions 766.

In an embodiment, the chamber volume 783 may be suitable for striking a plasma 782. That is, the chamber volume 783 may be a vacuum chamber. In an embodiment, only the second surface 762 is exposed to the chamber volume 783. However, some embodiments may include a protection layer (not shown) over the second surface 762 to protect the second surface 762 from the processing environment. The other surfaces of the monolithic source array 750 are outside of the chamber volume 783 and, therefore, do not experience the low pressure conditions needed to strike a plasma 782. Accordingly, even when there are high electric fields in the gaps 775 between the sidewalls of the protrusions 766 and the conductive body 773, there is no plasma generated.

Figure 8:
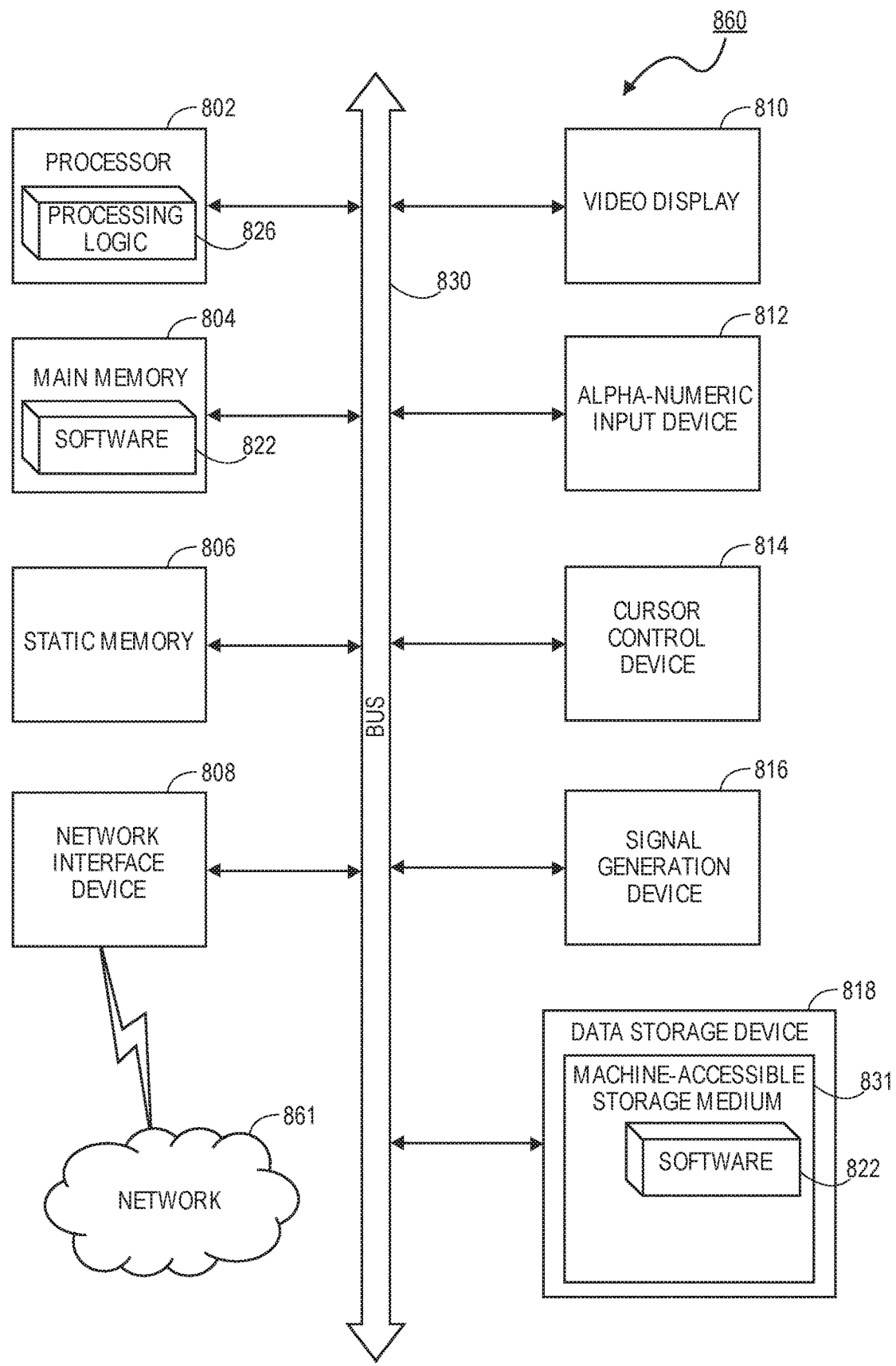
FIG. 8 illustrates a block diagram of an exemplary computer system that may be used in conjunction with a high-frequency plasma tool, in accordance with an embodiment.

Referring now to FIG. 8, a block diagram of an exemplary computer system 860 of a processing tool is illustrated in accordance with an embodiment. In an embodiment, computer system 860 is coupled to and controls processing in the processing tool. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 832 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. An assembly comprising:
   a source array, wherein the source array comprises a dielectric plate and a plurality of dielectric resonators extending up from a surface of the dielectric plate; and
   a housing assembly over the source array, wherein the housing assembly comprises:
   a first conductive layer over the surface of the dielectric plate, wherein the first conductive layer comprises a first coefficient of thermal expansion (CTE);
   a second conductive layer over the first conductive layer, wherein the second conductive layer comprises a second CTE that is different than the first CTE; and
   a plurality of openings through the housing assembly, wherein each opening passes through the first conductive layer and the second conductive layer, and wherein each opening accommodates one of the plurality of dielectric resonators.

2. The assembly of claim 1, wherein the dielectric plate has a third CTE, and wherein a difference between the first CTE and the third CTE is smaller than a difference between the second CTE and the third CTE.

3. The assembly of claim 1, wherein the housing is separated from the surface of the dielectric plate by a thermal interface material.

4. The assembly of claim 1, wherein the first conductive layer is mechanically coupled to the second conductive layer.

5. The assembly of claim 4, wherein the first conductive layer is bolted to the second conductive layer.

6. The assembly of claim 1, wherein the first conductive layer comprises titanium, wherein the second conductive layer comprises aluminum, and wherein the dielectric plate comprises aluminum oxide.

7. The assembly of claim 1, wherein the plurality of openings pass through an entire thickness of the housing assembly.

8. The assembly of claim 1, wherein the plurality of dielectric resonators and the dielectric plate are a monolithic structure.

9. A processing tool comprising:
a chamber; and
an assembly interfacing with the chamber, wherein the assembly comprises:
  a source array that comprises:
    a dielectric plate having a first surface and a second surface opposite from the first surface, wherein the second surface is exposed to an interior volume of the chamber, and wherein the first surface is exposed to an exterior environment; and
    a plurality of dielectric resonators that extend out from the first surface of the dielectric plate, wherein the plurality of dielectric resonators and the dielectric plate are a monolithic structure; and
  a housing assembly over the monolithic source array, wherein the housing assembly comprises:
    a first conductive layer over the surface of the dielectric plate, wherein the first conductive layer comprises a first coefficient of thermal expansion (CTE);
    a second conductive layer over the first conductive layer, wherein the second conductive layer comprises a second CTE that is different than the first CTE; and
    a plurality of openings through the housing assembly, wherein each opening passes through the first conductive layer and the second conductive layer, and wherein each opening accommodates one of the plurality of dielectric resonators.

10. The processing tool of claim 9, wherein each dielectric resonator comprises a hole, and wherein a monopole antenna is disposed in each hole.

11. The processing tool of claim 10, wherein each monopole antenna is coupled to a different high-frequency emission module.

12. The processing tool of claim 9, further comprising:
a plate over a surface of the housing facing away from the monolithic source array.

* * * * *